United States Patent
Sharma et al.

(10) Patent No.: US 6,828,260 B2
(45) Date of Patent: Dec. 7, 2004

(54) ULTRA-VIOLET TREATMENT OF A TUNNEL BARRIER LAYER THROUGH AN OVERLAYER A TUNNEL JUNCTION DEVICE

(75) Inventors: Manish Sharma, Mountain View, CA (US); Trueman H Denny, III, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 4 days.

(21) Appl. No.: 10/282,670

(22) Filed: Oct. 29, 2002

(65) Prior Publication Data

US 2004/0082201 A1 Apr. 29, 2004

(51) Int. Cl.$^7$ .......................... H01L 21/26; H01L 21/00
(52) U.S. Cl. .......................... 438/795; 438/3; 360/324.1
(58) Field of Search .............................. 438/308, 378, 438/476, 653, 771, 795, 796, 3; 360/324.1

(56) References Cited

U.S. PATENT DOCUMENTS

| | | | | |
|---|---|---|---|---|
| 5,229,361 A | * | 7/1993 | Shiraishi et al. ............ | 505/325 |
| 5,636,093 A | * | 6/1997 | Gijs et al. .................... | 360/126 |
| 6,281,538 B1 | * | 8/2001 | Slaughter .................... | 257/295 |
| 6,303,218 B1 | | 10/2001 | Kamiguchi et al. | |
| 6,452,204 B1 | | 9/2002 | Ishiwata et al. | |
| 2002/0052069 A1 | * | 5/2002 | Jiroku et al. ................ | 438/166 |

FOREIGN PATENT DOCUMENTS

| WO | WO01/84643 | 11/2001 |
|---|---|---|
| WO | WO 03/054886 | 7/2003 |

OTHER PUBLICATIONS

Girgis et al., "Tunnel Magnetoresistance Devices Processed by Oxidation in Air and UV Assisted Oxidation in Oxygen", Apr. 2000, IEEE Trans. on Electron Devices, pp. 697–701.*
Lauer et al., "Modification of Charge Produced during Plasma Exposure in Aluminum Oxide by Vacuum Ultraviolet Radiation", May 2001, Amer. Vac. Soc., 6th International Symp. on Plasma Process–Induced Damage, pp. 68–71.*
Title: Ultraviolet Light Assisted Oxidation for Magnetic Tunnel Junctions Authors: P rottlander, H Kohlstedt, and P Grunberg Source: Journal of Applied Physics, vol. 87, No. 9, pp 6067–6069, May 2000.

(List continued on next page.)

Primary Examiner—Mathew Smith
Assistant Examiner—Lex H. Malsawma
(74) Attorney, Agent, or Firm—Trueman H. Denny, III

(57) ABSTRACT

A method of treating an electrically non-conductive tunnel barrier layer through an overlayer of a tunnel junction device with ultra-violet light is disclosed. The method includes irradiating a tunnel barrier layer with ultra-violet light through at least one overlayer that covers the tunnel barrier layer to activate oxygen or nitrogen atoms disposed in the barrier layer so that those atoms will react with a target material of the tunnel barrier layer to form a uniformly oxidized or nitridized tunnel barrier layer having minimal or no defects therein and/or a desired breakdown voltage. The ultra violet light can irradiate the tunnel barrier layer during or after the formation of the overlayer. Heat can be applied before, during, or after the irradiation step to increase the activation rate and to further reduce defects. The method is applicable to any tunnel junction device including a magnetic field sensitive memory device such as a MRAM.

11 Claims, 4 Drawing Sheets

OTHER PUBLICATIONS

Title: Temperature Dependent Resistance of Magnetic Tunnel Junctions as a Quality Proof of the Barrier Authors: U Rudiger, R Calarco, U May, K Samm, J Hauch, H Kittur, M Sperlich and G Guntherodt Source: Journal of applied Physics, vol. 89, No. 11, pp 7573–7575, Jun. 2001.

Title: Temperature Dependent magnetoresistance of magnetic tunnel junctions with ultraviolet light–assisted oxidized barriers Authors: U May, K Samm, J Hauch, H Kittur, J Hauch, R Calarco, U Rudiger and G Guntherodt Source: Applied Physics Letter, vol. 78, No. 14, pp 2026–2028 Apr. 2001.

Rottlander P et al: "Magnetic Tunnel Junctions Prepared by Ultraviolet Light Assisted Oxidation" Journal of Magnetism and Magnetic Materials, Elsevier Science Publishers, Amsterdam, NL, vol. 210, No. 1–3 Feb. 2000 (Feb. 2002, pp. 251–256 XP004186778 ISSN: 0304–8853.

May U et al: "Temperaute–Dependent Magnetoresistance of Magnetic Tunnel Junctions with Ultraviolet Light–Assisted Oxidized Barriers" Applied Physics Letters, American Institute of Physics, New York, US vol. 78, No. 14, Apr. 2, 2001 (Apr. 2, 2001), pp. 2026–2028 xpoo1017513.

Rottlaender P et al: Ultraviolet Light Assisted Oxidation for Magnetic Tunnel Junctions Journal OA Applied Physics, American Institute of Physics, New York, US vol. 87, No. 9, May 1, 2000 (May 1, 2000) pp. 6067–6069, XP00095397.

Boeve H et al: "Strongly Reduced Bias Dependence in Spin–Tunnel Junctions Obtained by Ultraviolet Light Assisted Oxidation" Applied Physics Letters, American Institute of Physics, New York, US vol. 76, No. 8, Feb. 8, 2000, pp. 1048–1050, XP000934725.

* cited by examiner

ULTRA-VIOLET TREATMENT OF A TUNNEL BARRIER LAYER THROUGH AN OVERLAYER A TUNNEL JUNCTION DEVICE

FIELD OF THE INVENTION

The present invention relates generally to a method for exposing a tunnel barrier layer of a tunnel junction device to ultra-violet light through an overlayer that covers the tunnel barrier layer. More specifically, the present invention relates to a method for exposing an electrically non-conductive tunnel barrier layer of a tunnel junction device to ultra-violet light through an overlayer that covers the tunnel barrier layer in order to heal out defects in the tunnel barrier layer.

BACKGROUND OF THE ART

Magnetic tunnel junctions (MJT) are devices that include two ferromagnetic (FM) layers of material that are separated by a thin dielectric layer (i.e. an insulating layer) which acts as a tunnel barrier. Uses for tunnel junction devices include magnetic field sensors and thin film high density read and write heads for hard disk drives. Magnetic Random Access Memory (MRAM) is an emerging technology that also incorporates a tunnel junction and can provide an alternative to traditional data storage technologies. MRAM has desirable properties such as fast access times like DRAM and non-volatile data retention like hard disk drives. MRAM stores a bit of data (i.e. information) as an alterable orientation of magnetization in a patterned thin film magnetic element that is referred to as a data layer, a storage layer, a free layer, or a data film. The data layer is designed so that it has two stable and distinct magnetic states that define a binary one ("1") and a binary zero ("0"). Although the bit of data is stored in the data layer, many layers of carefully controlled magnetic and dielectric thin film materials are required to form a complete magnetic memory element. One prominent form of magnetic memory element is a spin tunneling device. The physics of spin tunneling is complex and good literature exists on this subject.

In FIG. 1a, a prior MRAM memory element 101 includes a data layer 102 and a reference layer 104 that are separated by a thin tunnel barrier layer 106. Typically the tunnel barrier layer 106 is a thin film with a thickness that is less than about 2.0 nm. In a tunnel junction device such as a tunneling magnetoresistance memory (TMR) the barrier layer 106 is an electrically non-conductive dielectric material such as aluminum oxide ($Al_2O_3$), for example. The tunnel barrier layer 106 is an insulator through which a tunneling current passes. The magnitude of the tunneling current and the quality of the tunneling current are greatly influenced by the quality of the insulator used for the tunnel barrier layer 106. As a voltage that is applied across the tunnel barrier layer 106 is increased, the tunneling current increases in a nonlinear fashion.

The reference layer 104 has a pinned orientation of magnetization 108, that is, the pinned orientation of magnetization 108 is fixed in a predetermined direction and does not rotate in response to an external magnetic field. In contrast the data layer 102 has an alterable orientation of magnetization 103 that can rotate between two orientations in response to an external magnetic field. The alterable orientation of magnetization 103 is typically aligned with an easy axis E of the data layer 102.

In FIG. 1b, when the pinned orientation of magnetization 108 and the alterable orientation of magnetization 103 point in the same direction (i.e. they are parallel to each other) the data layer 102 stores a binary one ("1"). On the other hand, when the pinned orientation of magnetization 108 and the alterable orientation of magnetization 103 point in opposite directions (i.e. they are anti-parallel to each other) the data layer 102 stores a binary zero ("0").

The data layer 102 and the reference layer 104 serve as electrodes of a tunnel junction device which allow the state of the bit stored in the data layer 102 to be sensed by measuring a resistance across the data layer 102 and the reference layer 104 or a by measuring a magnitude of the aforementioned tunneling current. Although the reference layer 104 is shown positioned below the tunnel barrier layer 106, the actual position of the data layer 102 and the reference layer 104 will depend on the order in which they are formed in a process for fabricating the magnetic memory cell 101. Accordingly, the data layer 102 can be formed first and the tunnel barrier layer 106 formed on top of the data layer 102.

Ideally, the tunnel barrier layer 106 of a tunnel junction device is flat and has a uniform thickness T throughout its cross-sectional area. Moreover, an ideal tunnel barrier layer 106 would be made from a dielectric material that is homogenous. One of the criteria for an ideal tunnel barrier layer 106 is that it have a high breakdown voltage. That is, the voltage at which the dielectric material of the tunnel barrier layer 106 breaks down and the tunnel barrier layer 106 acts as a shorted resistance.

However, in tunnel junction devices, such as the prior memory cells 101, one problem that detrimentally effects operation of the memory cell 101 is that defects in the tunnel barrier layer 106 result in a low breakdown voltage or an electrical short. Those defects include pin holes, bubbles, surface irregularities, metal inclusions, and non-uniformity of thickness in the tunnel barrier layer 106, just to name a few.

In FIG. 2, a material for the tunnel barrier layer 106 is formed or deposited on a supporting layer 110 that can be the reference layer 106 or the data layer 102 of a magnetic field sensitive memory cell, for example. For instance, the material for the tunnel barrier layer 106 can be aluminum (Al). The material is then exposed to oxygen ($O_2$) and is oxidized to form aluminum oxide ($Al_2O_3$). However, the prior oxidation process doesn't uniformly oxidize all of the aluminum atoms and as a result there remains un-oxidized aluminum atoms 111 that form metal inclusion defects in the tunnel barrier layer 106. A portion of the oxygen atoms 112 remains un-reacted with the material 111 for the tunnel barrier layer 106 (i.e the aluminum); however, those un-reacted oxygen atoms 112 remain incorporated in the tunnel barrier layer 106. Similarly, some of the oxygen atoms 112 react with and oxidize a portion of a material 113 for the supporting layer 110. As a result, oxidized atoms 113 at an interface between the tunnel barrier layer 106 and the supporting layer 110 create a defect that lowers the break down voltage of the tunnel barrier layer 106.

Prior methods for depositing or forming the tunnel barrier layer 106 such as RF-sputtering, plasma oxidation, or UV-ozone oxidation ultimately leave some defects in the tunnel barrier layer 106 that result in a poor tunneling barrier with weak points therein that cause shorting or a low breakdown voltage. Moreover, the existence of those defects makes it necessary to form a thicker nitride/oxide layer for the tunnel barrier layer 106. Conversely, if the dielectric material is a really good dielectric, then the thickness of the tunnel barrier layer 106 can be reduced. A thinner tunnel barrier layer 106 also helps in improving uniformity across an entire wafer that carries multiple tunnel junction devices. A thinner tunnel barrier layer 106 also lowers absolute resistance of the tunnel junction which can be important in some applications.

However, in FIG. 2, after the prior tunnel barrier layer 106 is formed on the supporting layer 110, it is often necessary to deposit a next layer 120 in the tunnel junction stack for several reasons. The next layer 120 can be any layer necessary in the fabrication of a tunnel junction device.

First, it is desirable to control further uncontrolled oxidation of the tunnel barrier layer 106. To that end, the next layer 120 is deposited over the tunnel barrier layer 106 to cap off the tunnel barrier layer 106 thereby rendering it substantially inert to further uncontrolled oxidation.

Second, it is desirable to prevent oxidation and/or contamination of the tunnel barrier layer 106 that would result if the tunnel barrier layer 106 were exposed to atmosphere (i.e. air) by either breaking vacuum in the processing equipment or by allowing atmosphere to contaminate the ambient of the processing equipment.

Finally, it may be desirable to deposit the next layer 120 in situ as part of the fabrication process for a tunnel junction device so that the deposition of the tunnel barrier layer 106 and the next layer 120 are sequential steps in the fabrication process.

On the other hand, the aforementioned defects in the tunnel barrier layer 106 still remain after the next layer 120 is formed and those defects need to be reduced or eliminated in order to produce a tunnel barrier layer with desirable characteristics such as a minimal defect density and a high breakdown voltage, for example.

Consequently, there exists a need for a method of treating an electrically non-conductive tunnel barrier layer through an overlayer in a tunnel junction device so that an oxidation or nitridation of the tunnel barrier layer is uniform and homogenous throughout the tunnel barrier layer.

SUMMARY OF THE INVENTION

The method of the present invention address the aforementioned needs for a uniform tunnel barrier layer by exposing an electrically non-conductive tunnel barrier layer of a tunnel junction device to ultra-violet light that irradiates the tunnel barrier layer through at least one overlayer that covers the tunnel barrier layer. Oxygen or another reactant, such as nitrogen, disposed in the tunnel barrier layer from a previous processing step is activated by the ultra-violet radiation and heals out defects in the tunnel barrier layer. The ultra-violet light can be from an ultra-violet light source that is incorporated into an existing piece of processing equipment. The tunnel barrier layer can be irradiated by the ultra-violet light during the formation of the overlayer or the tunnel barrier layer can be irradiated after the formation of the overlayer. Either process can occur in situ so that potential contamination and/or unwanted oxidation/nitridation of the tunnel barrier layer or other layers of thin film in a MRAM stack or other tunnel junction device are reduced or eliminated. One advantage of the method of the present invention is that it can be easily integrated with existing microelectronics processing equipment. With the overlayer, irradiation of the the tunnel barrier layer with the ultra-violet light can occur ex situ also.

In one embodiment of the present invention, heat from a heat source is applied to the tunnel barrier layer of the tunnel junction device to further increase the activation process. As a result, more defects are removed and processing time for the activation can be reduced. The heating can occur before, during, or after the irradiation with the ultra-violet light.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 1b is a schematic depicting data storage in the prior magnetic memory element of FIG. 1a.

DETAILED DESCRIPTION

Figure 1A:
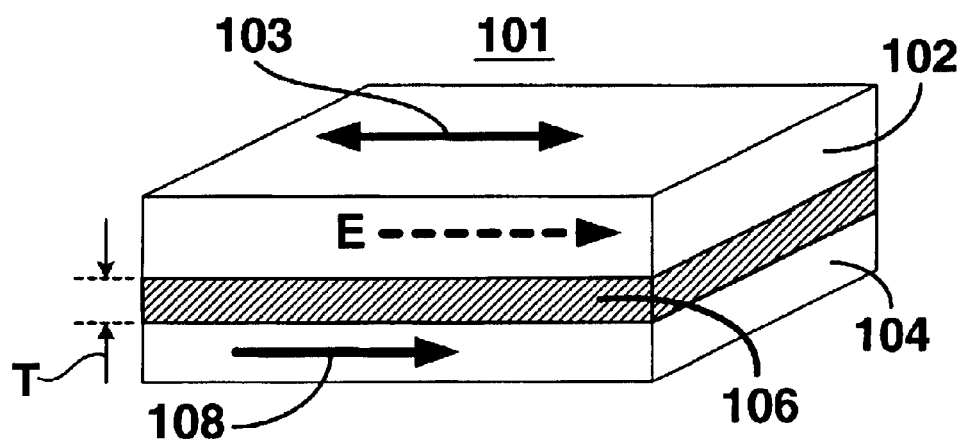
FIG. 1a is a profile view of a prior magnetic memory element.
Figure 1B:
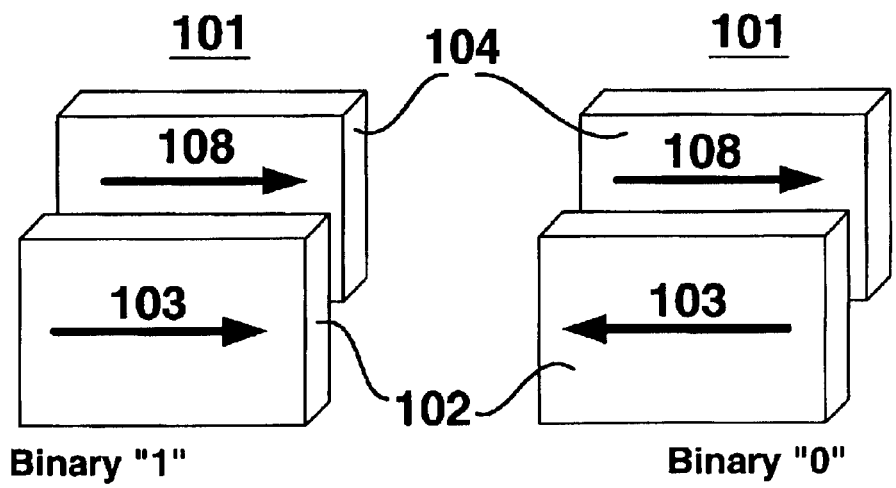
Figure 2:
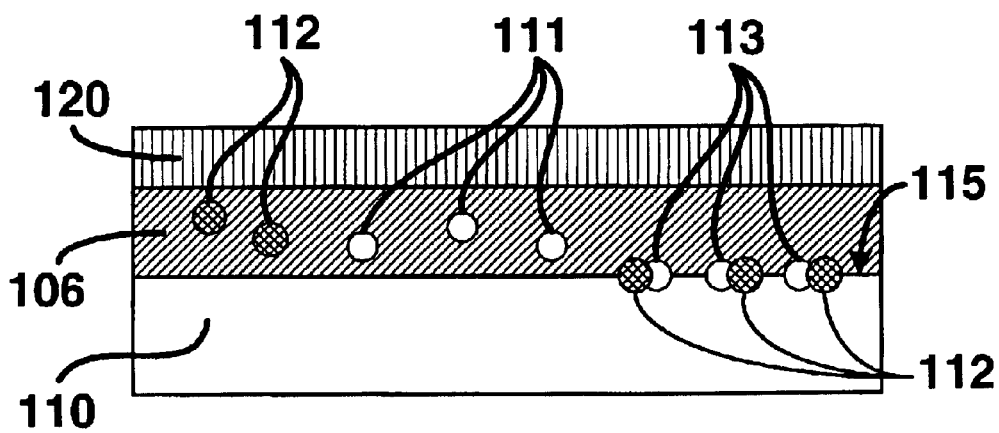
FIG. 2 is a cross-sectional view depicting defects in a prior tunnel barrier layer that is covered by a next layer of a prior tunnel junction device.

In the following detailed description and in the several figures of the drawings, like elements are identified with like reference numerals.

As shown in the drawings for purpose of illustration, the present invention is embodied in a method of treating an electrically non-conductive tunnel barrier layer of a tunnel junction device using ultra-violet light to irradiate the tunnel barrier layer through at least one overlayer that covers the tunnel barrier layer. The ultra-violet light is operative to activate a reactant disposed in the tunnel barrier layer so that the reactant reacts with a material of the tunnel barrier layer resulting in an increase in a uniformity of oxidation or nitridation of the tunnel barrier layer. Resulting is an electrically non-conductive material with reduced defects, improved homogeneity, and a higher breakdown voltage. Although the method of the present invention is applicable to treating defects in a tunnel barrier layer of a tunnel junction device, the present invention is not limited to the treatment of tunnel barrier layers and is applicable to any dielectric layer of a tunnel junction device in which is desirable to heal out defects in the dielectric layer.

Figure 3:
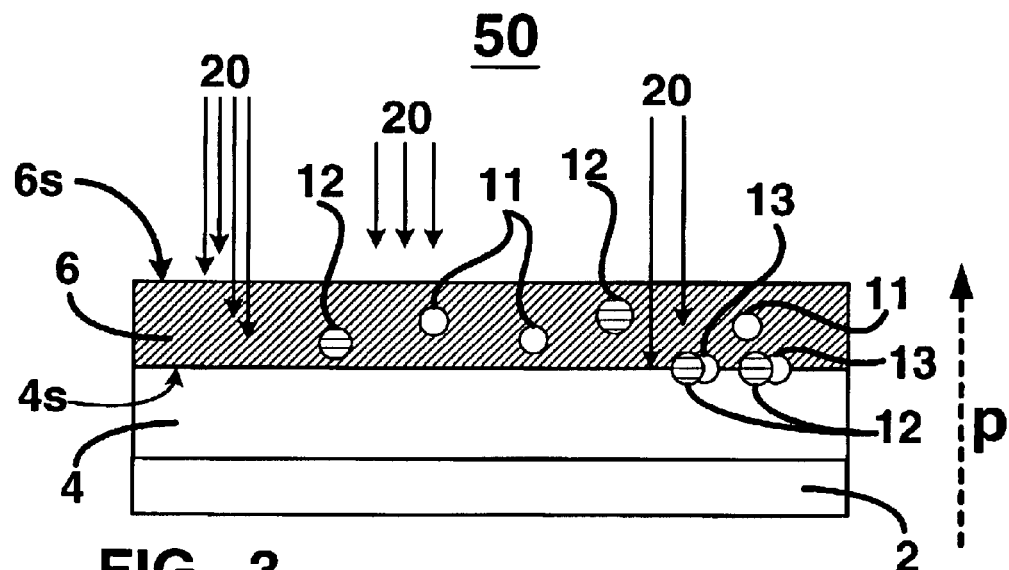
FIG. 3 is a cross-sectional view depicting a plurality of thin film layers of a tunnel junction device including a tunnel barrier layer with defects therein according to the present invention.

In one embodiment of the present invention, as illustrated in FIG. 3, a tunnel barrier layer 6 is formed on a precursor layer 4 of a tunnel junction device 50. The precursor layer 4 can be any of the layers of thin film materials that comprise the tunnel junction device 50 including but not limited to one or more layers of a data layer (also called a storage layer or free layer) or one or more layers of a reference layer (also called a pinned layer) of a magnetic field sensitive memory device. For example, the tunnel barrier layer 6 and the precursor layer 4 can be one of several layers of a TMR memory cell. The tunnel junction device 50 can include other layers such as a layer 2 that supports the precursor layer 4. The tunnel junction device can also include a substrate layer (not shown) such as a silicon (Si) wafer, for example.

The layers 2, and 4 of the tunnel junction device 50 are formed in an ordered sequence as indicated by a dashed arrow p such that layer 2 precedes layer 4 in the ordered sequence p. Accordingly, the precursor layer 4 is that layer which precedes the tunnel barrier layer 6 in the ordered sequence p. Subsequent process steps (not shown) that occur after the formation of the tunnel barrier layer 6 in the ordered sequence p are required to complete the formation of the tunnel junction device 50.

Although a magnetic field sensitive memory device such as the tunnel junction device 50 can include a plurality of layers of thin film materials, for purposes of illustration, the tunnel junction device 50 is shown as including the precursor layer 4, and the tunnel barrier layer 6, but is not to be construed as being limited to those layers only.

In FIG. 3, the tunnel barrier layer 6 is formed on the precursor layer 4 of the tunnel junction device 50. Microelectronics processing techniques that are commonly used for forming thin film materials can be used to form the tunnel barrier layer 6. For example, a deposition or a sputtering process can be used to deposit a material for the tunnel barrier layer 6 on a surface 4s of the precursor layer 4.

Suitable materials for the tunnel barrier layer 6 include but are not limited to aluminum (Al), magnesium (Mg), boron (B), and tantalum (Ta). The process for forming the tunnel barrier layer 6 can be a process including but not limited to RF sputtering, DC sputtering, evaporation, plasma assisted deposition, chemical vapor deposition (CVD), physical vapor deposition (PVD), plasma enhanced chemical vapor deposition (PECVD), molecular beam epitaxy (MBE), and metalorganic chemical vapor deposition (MOCVD). The oxide or nitride material for the tunnel barrier layer 6 can also be reactively sputtered from an oxide or a nitride target material. For instance, if the material to be deposited is aluminum oxide, then the target material can be $Al_2O_3$. However, after the sputtering process is over, the defects in the tunnel barrier layer 6 still need to be healed out.

Prior to the formation of a subsequent overlayer, the tunnel barrier layer 6 is transformed into an electrically non-conductive material (i.e. a dielectric material) using an oxidation process for the formation of an oxide, or a nitridation process for the formation of a nitride. In FIG. 3, a reactant 12 such as atoms of oxygen ($O_2$) or atoms of nitrogen ($N_2$) are introduced 20 into the material of the tunnel barrier layer 6. Some of the reactant 12 chemically reacts with a material of the tunnel barrier layer 6 to form an electrically non-conductive material such as an oxide in the case of oxygen ($O_2$) or a nitride in the case of nitrogen ($N_2$).

If the tunnel barrier layer 6 is formed using a sputtering process, then the tunnel barrier layer 6 is already an electrically non-conductive material as deposited. A process including but not limited to a sputtering process and a reactive sputtering process can be used to form the electrically non-conductive tunnel barrier layer 6. For example, a sputtering target such as aluminum oxide ($Al_2O_3$), aluminum nitride ($AlN_x$), magnesium oxide (MgO), or tantalum oxide ($TaO_x$) can be the source material for the electrically non-conductive tunnel barrier layer 6. In that case, there is no need to perform a subsequent oxidation or nitridation process to transform the material of the tunnel barrier layer 6 into an electrically non-conductive material. Nevertheless, even with a sputtering process, there will remain in the tunnel barrier layer 6 some reactant 12 that has not chemically reacted with the material 11 of the tunnel barrier layer 6.

In either case, not all of the reactant 12 chemically reacts with the material 11 of the tunnel barrier layer 6. Consequently, some of the reactant remains in the material of the tunnel barrier layer 6 in an un-reacted state (see reference numeral 12). Similarly, some of the material for the tunnel barrier layer 6 also remains un-reacted (see reference numeral 11). For instance, atoms of aluminum can remain un-reacted. Additionally, some of the reactant 12 reacts with a material (see reference numeral 13) for the precursor layer 4 in a region proximate the surface 4s of the precursor layer 4.

Insofar as the reactant 12 that has reacted with the material 13 is not reacted with the material 11 of the tunnel barrier layer 6, that reactant is also in an un-reacted state because it has not reacted with the intended target material 11 of the tunnel barrier layer 6 and because there are free atoms 11 of the target material within the tunnel barrier layer 6 that are available to react with the reactant 12. The reactant 12 that remains un-reacted can give rise to the aforementioned defects in the tunnel barrier layer 6 that can reduce the break down voltage and/or result in non-uniformity in the tunnel barrier layer 6.

Figure 4A:
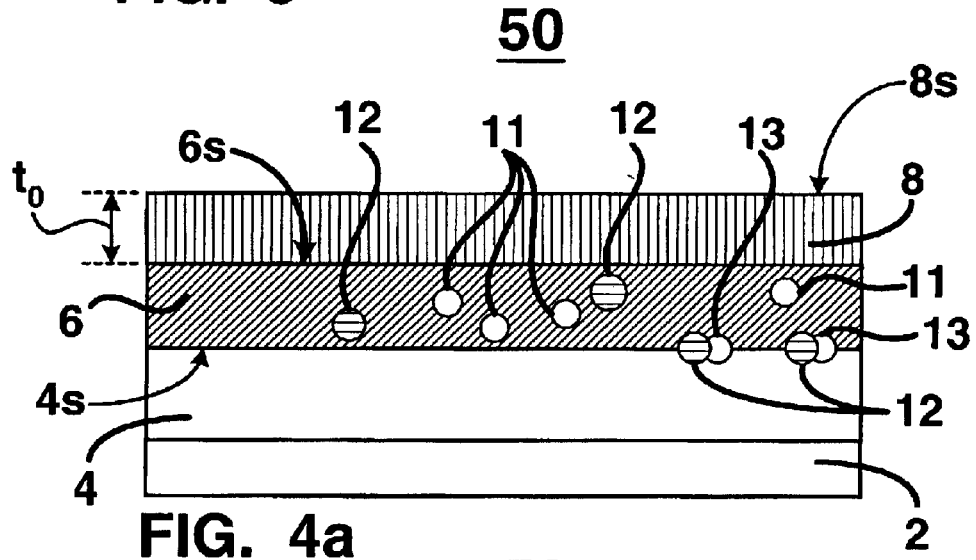
FIGS. 4a and 4b are cross-sectional views depicting formation of at least one overlayer on a tunnel barrier layer with defects therein according to the present invention.
Figure 4B:
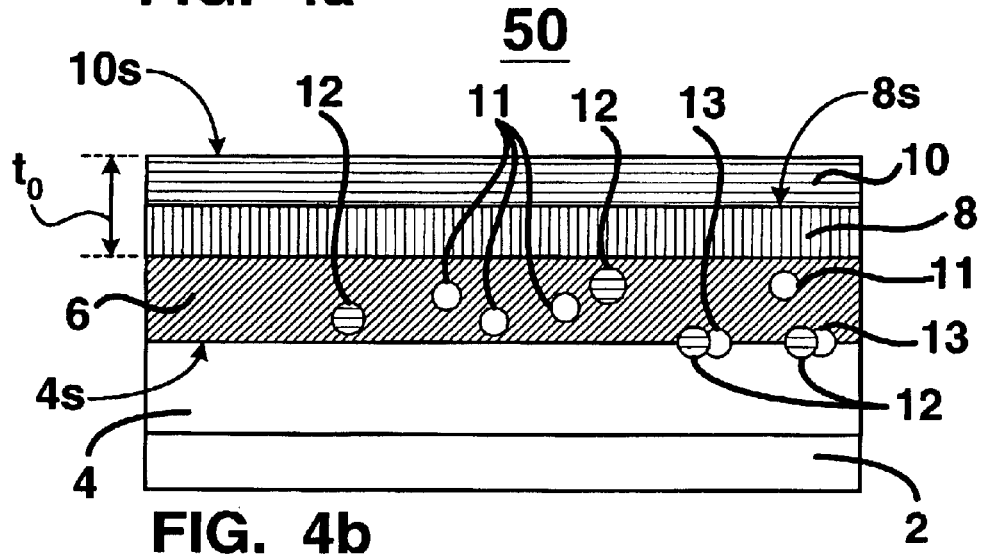

In FIGS. 4a and 4b, after the tunnel barrier layer 6 is formed and is substantially transformed into an electrically non-conductive material via sputtering, oxidation, or nitridation, then as part of one or more subsequent processing steps, at least one overlayer 8 is formed on a surface 6s of the tunnel barrier layer 6. The overlayer 8 covers the tunnel barrier layer 6 and has a predetermined thickness $t_0$. In FIG. 4b, another overlayer 10 is formed on a surface 8s of the overlayer 8 and both layers (8, 10) cover the tunnel barrier layer 6 and a combined predetermined thickness of those layers (8, 10) is $t_0$ (i.e. the thickness of overlayer 8 plus the thickness of overlayer $10=t_0$).

However, after one or more of the layers (8, 10, etc.) have been formed, the aforementioned defects (11, 12, 13) still remain in the tunnel barrier layer 6 and need to be healed out.

Figure 5A:
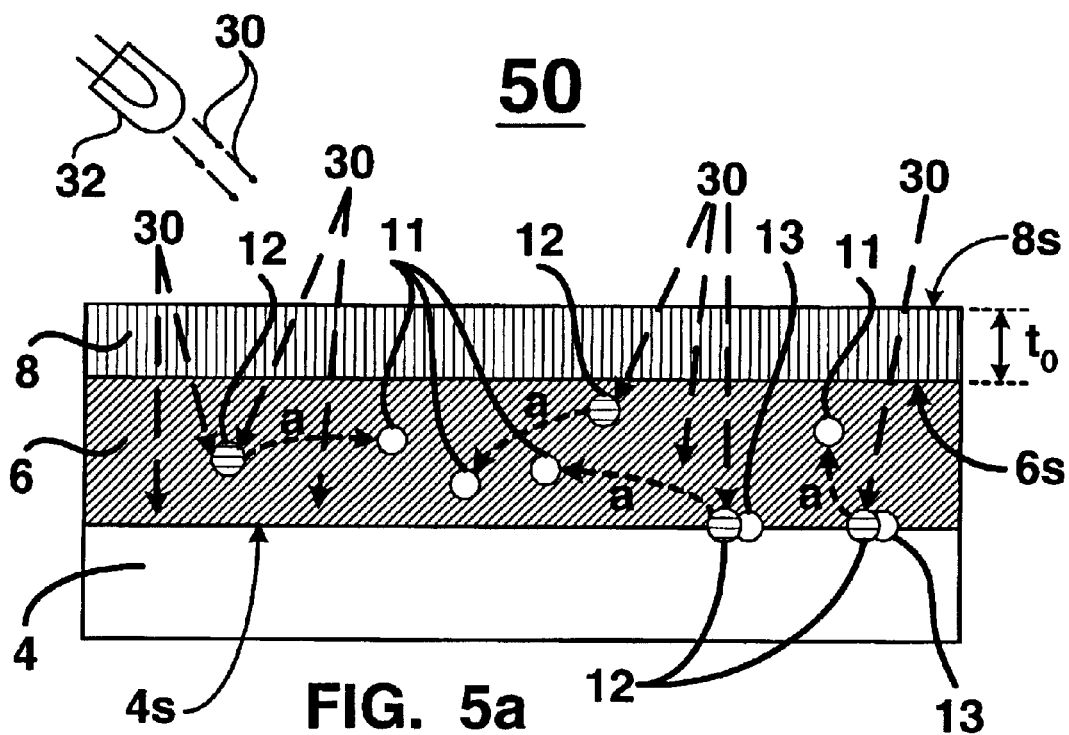
FIGS. 5a and 5b are cross-sectional views depicting irradiating a tunnel barrier layer with ultra-violet light through at least one overlayer and an activation of a reactant according to the present invention.

In FIG. 5a, ultra-violet light 30 from a light source 32 (i.e. a light source that emits radiation in the ultra-violet spectrum) irradiates the tunnel barrier layer 6 through the overlayer 8. A portion of the ultra-violet light 30 is incident on the reactant 12 that is disposed in the tunnel barrier layer 6. The ultra-violet light 30 activates the reactant 12 so that it chemically reacts with the material 11 of the tunnel barrier layer 6 and transforms the material 11 into the electrically non-conductive material. Essentially, before the irradiation with the ultra-violet light 30, there are free atoms of the reactant 12 and free atoms of the material 11 of the tunnel barrier layer 6. Once irradiation has begun, the energy of the ultra-violet light 30 activates the reactant 12 so that the reactant 12 chemically reacts with the free atoms of the material 11 of the tunnel barrier layer 6 to form the electrically non-conductive material.

For example, if the material of the tunnel barrier layer 6 is aluminum (Al) and the reactant is oxygen ($O_2$), then the desired electrically non-conductive material is aluminum oxide ($Al_2O_3$). Prior to the irradiation with the ultra-violet light 30, there will be free atoms of aluminum (see reference numeral 11) and free atoms of oxygen (see reference numeral 12) within the tunnel barrier layer 6. The irradiation operates to activate the oxygen atoms by transferring energy from the ultra-violet light 30 to the oxygen atoms thereby providing the energy necessary to complete the chemical reaction of the oxygen atoms with the aluminum atoms to form aluminum oxide ($Al_2O_3$).

The source 32 for the ultra-violet light 30 can be a commercially available UV light source including but not limited to a cold cathode UV grid lamp or a hot cathode UV spiral lamp, for example. The wavelength of the ultra-violet light 30 will be application dependent. Typically, light having a wavelength (in nanometers) between about 4 nm and about 400 nm is considered to be ultra-violet radiation (UV). Near UV is in a range of about 400 nm to about 300 nm, Far UV is in a range from about 300 nm to about 200 nm, and anything below about 200 nm is considered to be Extreme UV. Preferably, the wavelength for the ultra-violet light 30 is in a range from about 200 nm to about 400 nm.

The predetermined thickness $t_0$ of the overlayer 8, or in the case of more than one overlayer, the combined predetermined thickness $t_0$ of those layers (e.g. 8, 10, etc.), should be selected such that the ultra-violet light 30 will penetrate those layers and thoroughly irradiate the tunnel barrier layer 6. Furthermore, the materials selected for the overlayer (8, 10, etc.) should be optically transparent to the wavelength of the ultra-violet light 30.

For example, the overlayer 8 should not substantially reflect all of the ultra-violet light 30 nor substantially absorb or substantially attenuate the ultra-violet light 30. Because the layers of thin film materials that comprise the tunnel junction device 50 are typically a few nanometers (nm) thick or less, and in some instances are on the order of a few hundred angstroms thick, ultra-violet light 30 in the Near UV, the Far UV, and all but the lowest end of the Extreme UV spectrum will penetrate at least one overlayer 8 and throughly irradiate the tunnel barrier layer 6.

Figure 5B:
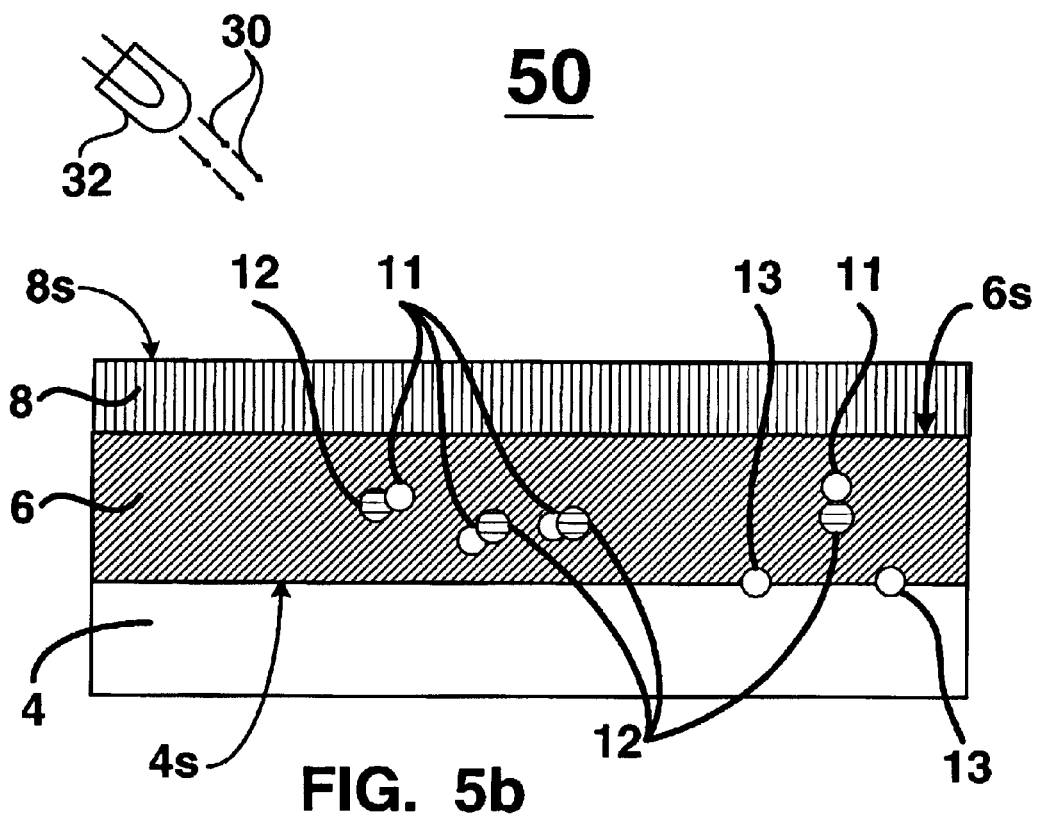

In FIG. 5a, a portion of the ultra-violet light 30 (see dashed arrows) is incident on the reactant 12, the reactant 12 is activated (see dashed arrows a), and the reactant 12 chemically reacts with the material 11 of the tunnel barrier layer 6. In FIG. 5b, a chemical bonding of the reactant 12 with the with the material 11 results in the forming of the electrically non-conductive material. Moreover, in FIG. 5a, a chemical bond between the material 13 and the reactant 12 is broken (by the ultra-violet radiation 30) so that the reactant 12 is free to bond with the material 11 as illustrated in FIG. 5b.

In FIG. 5b, the reactant 12 has reacted with the material 11 of the tunnel barrier layer 6 to form the electrically non-conductive material thereby reducing or eliminating the aforementioned defects and improving the uniformity and the breakdown voltage of the tunnel barrier layer 6.

If the process used to transform the tunnel barrier layer 6 into an electrically non-conductive material prior to the formation of the overlayer 8 is an oxidation process, then that oxidation process can be a process including but not limited to plasma oxidation, natural oxidation, room temperature natural oxidation (i.e. at about 25° C.), and UV-ozone oxidation.

The UV-ozone oxidation is not to be confused with irradiation of the tunnel barrier layer 6 with the ultra-violet light 30 through the overlayer 8. In sharp contrast to the ultra-violet irradiation method of the present invention, UV-ozone oxidation is a separate process wherein oxygen ($O_2$) gas is exposed to ultra-violet light to convert the oxygen gas to ozone ($O_3$). The ozone is then introduced into the tunnel barrier layer 6. The ozone increases a reaction rate with the material 11 of the tunnel barrier layer 6 because ozone ($O_3$) is highly reactive and is more reactive than $O_2$ with the material 11 of the tunnel barrier layer 6. Regardless of the process used for oxidation or nitridation, the reactant 12 can be a material including but not limited to oxygen ($O_2$), ozone ($O_3$), or nitrogen ($N_2$).

The irradiating of the tunnel barrier layer 6 with the ultra-violet light 30 can be continued for a predetermined amount of time until a desired property of the tunnel barrier layer 6 is obtained. The desired property can be a property including but not limited to a predetermined defect density in the tunnel barrier layer 6, a predetermined breakdown voltage of the tunnel barrier layer 6, a change in a crystal structure of the tunnel barrier layer 6, and a change in a texture of a grain orientation of tunnel barrier layer 6.

For example, the defect density can be the number of metal inclusions (i.e. defects) per unit of area or unit of volume of the tunnel barrier layer 6. As another example, a texture of some grain orientations may grow as a result of irradiation with the ultra-violet 30. As yet another example, a crystal structure of the tunnel barrier layer 6 can change from amorphous to crystalline as a result of irradiation with the ultra-violet 30. Verification of the efficacy of some of the aforementioned desired properties of the tunnel barrier layer 6 can be accomplished by structural characterization using a tool such as a Transmission Electron Microscope (TEM), for example.

The irradiation with the ultra-violet 30 can occur during the formation of the overlayer or the irradiation with the ultra-violet 30 can occur after the formation of the overlayer. Therefore, in FIG. 5a the ultra-violet 30 can irradiate the tunnel barrier layer 6 while the overlayer 8 is being formed or after the overlayer 8 has been formed.

The ultra violet light 30 can be generated by an ultra-violet light source 32 that is positioned in a chamber (not shown) in which some or all of the processing of the tunnel junction device 50 takes place. The ultra-violet light source 32 can also irradiate the tunnel barrier layer 6 through a window that is optically transparent to a wavelength of the ultra violet light 30.

Figure 6A:
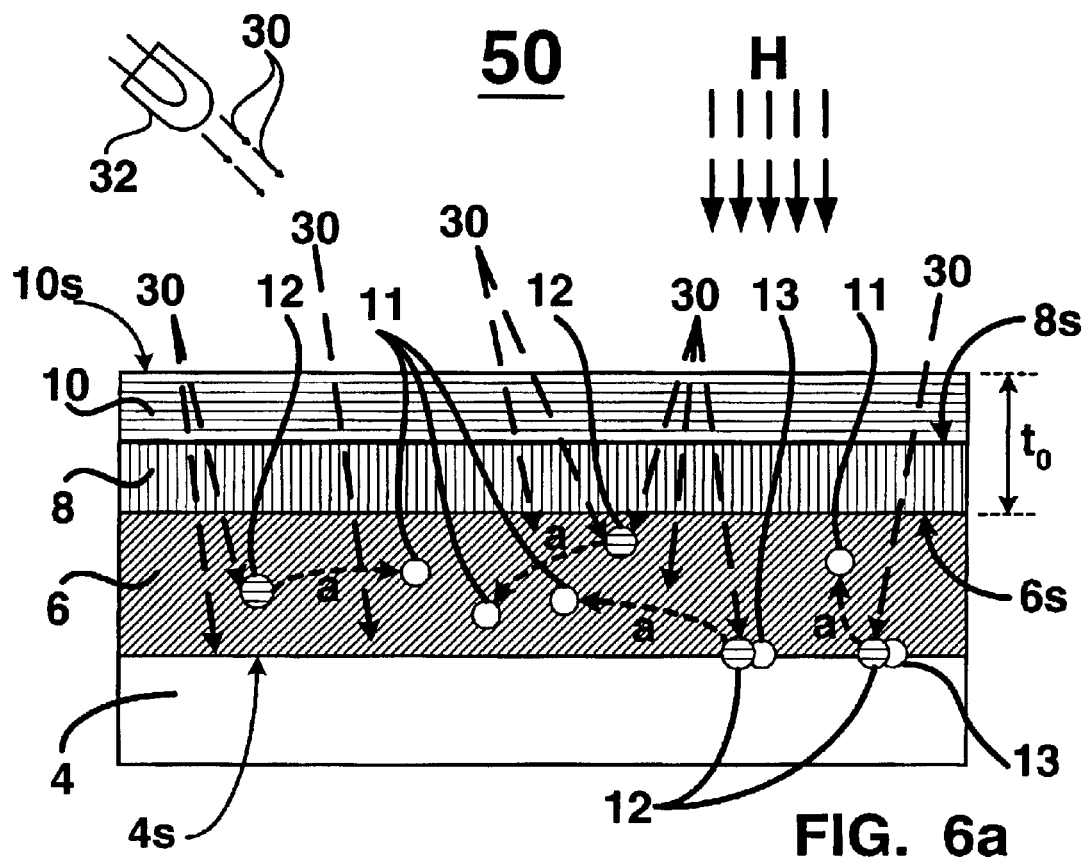
FIGS. 6a and 6b are cross-sectional views depicting heating the tunnel barrier layer to increase an activation rate of a reactant according to the present invention.
Figure 6B:
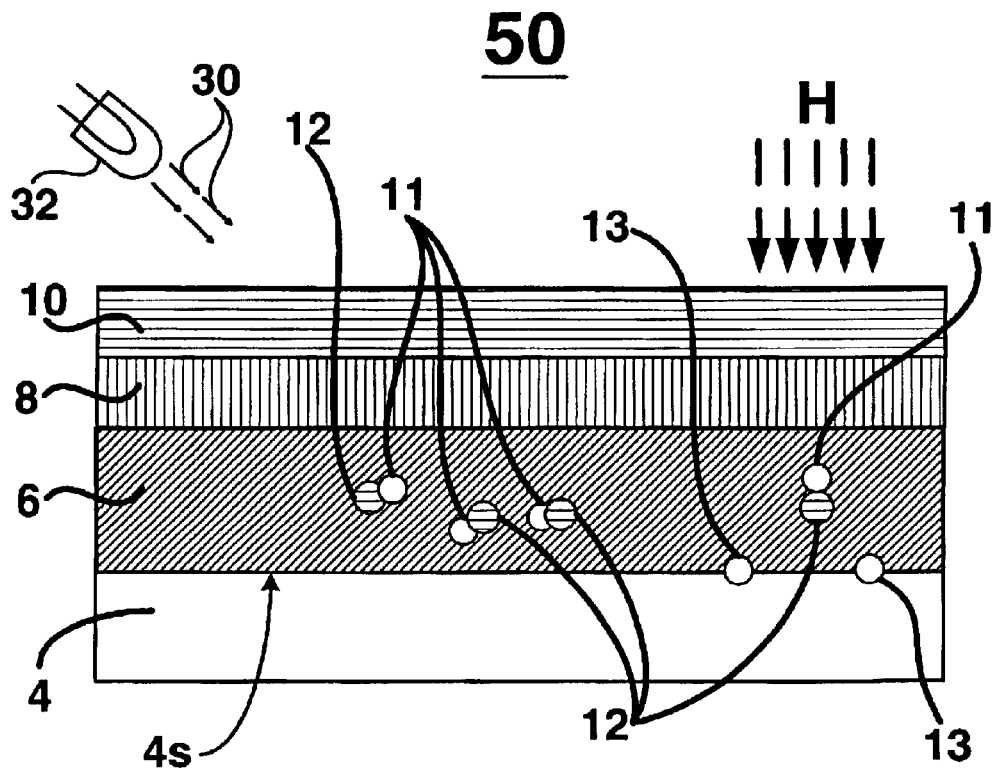

In another embodiment of the present invention, as illustrated in FIGS. 6a and 6b, the tunnel barrier layer 6 can be heated H during or after the irradiating process to increase an activation rate of the reactant 12 with the material 11 of the tunnel barrier layer 6. The heating H speeds up the activation process and removes more defects from the tunnel barrier layer 6.

In FIG. 6a, the tunnel barrier layer 6 is heated H to increase the activation rate. The reactant 12 is activated (see dashed arrows a) and chemically reacts with the material 11 of the tunnel barrier layer 6. A variety of methods that are well known in the microelectronics art can be used to heat H the tunnel barrier layer 6. For instance, a substrate (not shown) that carries the tunnel junction device 50 can be heated H by placing the substrate on a vacuum chuck, stage, sample platform, or the like that contains a heat source or is in thermal communication with a heat source. For example, a heat source such as a quartz infrared heat lamp, a resistance heater, or a metal ribbon radiant heater can be used to heat the substrate or the tunnel barrier layer 6. As was stated above, the heating of the tunnel barrier layer 6 can occur during or after the irradiation with the ultra-violet light 30.

In FIG. 6b, the reactant 12 has reacted with the material 11 of the tunnel barrier layer 6 to form the electrically non-conductive material thereby reducing or eliminating the aforementioned defects and improving the uniformity and the breakdown voltage of the tunnel barrier layer 6.

In FIGS. 6a and 6b, more than one overlayer (i.e. 8, 10) covers the tunnel barrier layer 6 and the ultra-violet light 30 penetrates those layers to irradiate the tunnel barrier layer 6. However, the heating H can be used with one overlayer or with more than one overlayer. The irradiation with the ultra-violet light 30 can occur during the formation of the overlayer 10 or after the formation of the overlayer 10.

Similarly, the heating H can occur during the formation of any of the layers (8, 10) or after the formation of those layers. Because activation of the reactant 12 by heating H operates to heal out the aforementioned defects (11, 12, 13), the heating H can also be applied to the tunnel barrier layer 6 before the formation of the overlayer (8, 10) and before the irradiation with the ultra-violet light 30. Moreover, the heating H can be reapplied anytime during the formation of the overlayer (8, 10) and the heating can be reapplied in isolation or in conjunction with the irradiation with the ultra-violet light 30.

In all of the embodiments described herein the irradiation with the ultra-violet light 30 and the heating H can occur in situ with other microelectronic processes for forming the tunnel junction device 50 and can occur during or after the formation of an overlayer.

Although several embodiments of the present invention have been disclosed and illustrated, the invention is not limited to the specific forms or arrangements of parts so described and illustrated. The invention is only limited by the claims.

What is claimed is:

1. A method of treating a tunnel barrier layer of a tunnel junction device, comprising:

forming an overlayer of a predetermined thickness on a previously formed tunnel barrier layer;

irradiating the tunnel barrier layer through the overlayer with ultra-violet light, the ultra-violet light penetrates the predetermined thickness of the overlayer and is incident on a reactant disposed in the tunnel barrier layer, and the ultra-violet light is operative to activate the reactant so that the reactant reacts with a material of the tunnel barrier layer and transforms the material into an electrically non-conductive material; and heating the tunnel barrier layer using a separate heat source, the heating occurring during the irradiating and the heating is operative to increase an activation rate of the reactant with the material of the tunnel barrier layer.

2. The method as set forth in claim 1 and further comprising:

continuing the irradiating with the ultra-violet light for a predetermined time until a desired property of the tunnel barrier layer is obtained.

3. The method as set forth in claim 2, wherein the desired property of the tunnel barrier layer is a property selected from the group consisting of a predetermined defect density in the tunnel barrier layer, a predetermined breakdown voltage of the tunnel barrier layer, a change in a crystal structure of the tunnel barrier layer, and a change in a texture of a grain orientation of tunnel barrier layer.

4. The method as set forth in claim 1, wherein the reactant is a material selected from the group consisting of oxygen, ozone, and nitrogen.

5. The method as set forth in claim 1, wherein the material for the tunnel barrier layer comprises a material selected from the group consisting of aluminum, magnesium, boron, and tantalum.

6. The method as set forth in claim 1, wherein the irradiating occurs at a time selected from the group consisting of during the forming of the overlayer and after the forming of the overlayer.

7. The method as set forth in claim 1, wherein the ultra-violet light has a wavelength from about 200 nm to about 400 nm.

8. The method as set forth in claim 1, wherein the heating with the separate heat source occurs during the forming of the overlayer.

9. The method as set forth in claim 1 and further comprising:

heating the tunnel barrier layer with a separate heat source after the irradiating to increase an activation rate of the reactant with the material of the tunnel barrier layer.

10. The method as set forth in claim 1 and further comprising:

heating the tunnel barrier layer with a separate heat source before the forming of the overlayer to increase an activation rate of the reactant with the material of the tunnel barrier layer.

11. The method as set forth in claim 10 and further comprising:

reapplying the heating at a time selected from the group consisting of during the forming of the overlayer and after the forming of the overlayer.

\* \* \* \* \*

UNITED STATES PATENT AND TRADEMARK OFFICE
CERTIFICATE OF CORRECTION

PATENT NO.   : 6,828,260 B2                                              Page 1 of 1
DATED        : December 7, 2004
INVENTOR(S)  : Manish Sharma et al.

It is certified that error appears in the above-identified patent and that said Letters Patent is hereby corrected as shown below:

<u>Title page, Item [54] and Column 1, line 3,</u>
Title, should read -- ULTRA-VIOLET TREATMENT OF A TUINNEL BARRIER LAYER THROUGH AN OVERLAYER IN A TUNNEL JUNCTION DEVICE --.

Signed and Sealed this

Tenth Day of May, 2005

JON W. DUDAS
*Director of the United States Patent and Trademark Office*